United States Patent
Petropoulos et al.

(10) Patent No.: US 6,278,275 B1
(45) Date of Patent: Aug. 21, 2001

(54) GRADIENT COIL SET WITH NON-ZERO FIRST GRADIENT FIELD VECTOR DERIVATIVE

(75) Inventors: Labros S. Petropoulos, Solon; Heidi A. Schlitt, Chesterland, both of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/419,597

(22) Filed: Oct. 18, 1999

(51) Int. Cl.$^7$ ........................................ G01V 3/00
(52) U.S. Cl. .................... 324/318; 324/309; 324/320
(58) Field of Search ............................. 324/318, 309, 324/307, 320, 300; 335/296

(56) References Cited

U.S. PATENT DOCUMENTS

| | | | |
|---|---|---|---|
| 4,794,338 | 12/1988 | Roemer et al. | 324/39 |
| 5,132,618 | 7/1992 | Sugimoto | 324/318 |
| 5,296,810 | 3/1994 | Morich | 324/318 |
| 5,736,858 | 4/1998 | Katznelson et al. | 324/318 |
| 5,942,898 | 8/1999 | Petropoulos et al. | 324/318 |
| 5,952,830 | 9/1999 | Petropoulos et al. | 324/318 |

*Primary Examiner*—Christine Oda
*Assistant Examiner*—Brij B Shrivastav
(74) *Attorney, Agent, or Firm*—Fay, Sharpe, Fagan, Minnich & McKee, LLP

(57) ABSTRACT

A gradient coil assembly (22) generates substantially linear magnetic gradients across the central portion of an examination region (14). The gradient coil assembly (22) includes primary x, y, and z-gradient coils (62, 66, 68) which generate a gradient magnetic field (90) having a non-zero first derivative in and adjacent the examination region. Preferably, the gradient coil assembly (22) includes secondary, shielding x, y, and z coils which generate a magnetic field which substantially cancels, in an area outside a region defined by the shielding coils, a fringe magnetic field generated by the primary gradient coils. The existence of a non-zero first derivative in and adjacent the examination region eliminates aliasing effects attributable to the non-unique gradient field values on either side of a rollover point (82). The non-unique values of the gradient magnetic field adjacent the rollover point caused structure near the rollover point to overlay each other (FIGS. 7B, 8B). The unique non-linearity of the present gradient (90) adjacent the edges expands (magnifies) the image adjacent the edges (FIGS. 7A, 8A). Because the expansion is unique, distortions at the edges are readily and accurately mapped (52) back to linear.

17 Claims, 7 Drawing Sheets

GRADIENT COIL SET WITH NON-ZERO FIRST GRADIENT FIELD VECTOR DERIVATIVE

BACKGROUND OF THE INVENTION

The present invention relates to the magnetic resonance arts. It finds particular application in conjunction with gradient coils for a magnetic resonance imaging apparatus and will be described with particular reference thereto. However, it is to be appreciated that the present invention will also find application in conjunction with localized magnetic resonance spectroscopy systems and other applications which utilize gradient magnetic fields.

In magnetic resonance imaging, a uniform magnetic field is created through an examination region in which a subject to be examined is disposed. A series of radio frequency pulses and magnetic field gradients are applied to the examination region. Gradient fields are conventionally applied as a series of gradient pulses with pre-selected profiles. The radio frequency pulses excite magnetic resonance and the gradient field pulses phase and frequency encode the induced resonance. In this manner, phase and frequency encoded magnetic resonance signals are generated.

More specifically, the gradient magnetic field pulses are typically applied to select and encode the magnetic resonance with spatial position. In some embodiments, the magnetic field gradients are applied to select a slice or slab to be imaged. Ideally, the phase or frequency encoding uniquely identifies spatial location.

In bore type magnets, linear magnetic field gradients are commonly produced by cylindrical gradient field coils wound on and around a cylindrical former. Discrete coils are wound in a bunched or distributed fashion on a similar or larger diameter cylindrical tube, commonly 30–65 centimeters in diameter or larger.

Historically, gradient coil designs were developed in a "forward approach," whereby a set of initial coil positions were defined and the fields, energy, and inductance calculated. If these quantities were not within the particular design criteria, the coil positions were shifted (statistically or otherwise) and the results re-evaluated. This iterative procedure continued until a suitable design was obtained.

Recently, gradient coils are designed using the "inverse approach," whereby gradient fields are forced to match predetermined values at specified spatial locations inside the imaging volume. Then, a continuous current density is generated which is capable of producing such fields. This approach is adequate for designing non-shielded or actively shielded gradient coil sets.

Often, shielded gradient coil sets are designed such that their gradient magnetic field has an inherent rollover point along, but near the outer edge of its perspective gradient axis. That is, the first derivative of the gradient magnetic field is zero at a certain location along the gradient axis and inside the physical volume bounded by the inner surface of the gradient structure. The gradient magnetic field takes on non-unique values after passing the rollover point where the first derivative of the gradient magnetic field is zero. The rollover point may be in the center or near the edge of the bore, beyond where the subject is positioned. This design is problematic for an imaging sequence with a large field of view (FOV) in which portions of the subject are disposed between the rollover point and the bore. Areas of a subject that are located beyond the rollover point will alias back into the image, which causes ghosting and distortion of the image. A gradient deghosting and distortion algorithm is then implemented during postprocessing in order to compensate for distortions in the image. The gradient distortion algorithm, particularly when applied to all three gradient coils, extends the image postprocessing time and extends significantly the overall time of the magnetic resonance study.

In addition, information in the raw data related to the voxels located beyond the rollover point cannot be recovered uniquely. Voxels on either side of the rollover point that experience the same gradient strength are encoded indistinguishably. This limits the maximum FOV of a given sequence and limits the range of translational movement for the examined subject inside the image volume. This problem is particularly apparent when imaging extremities, such as shoulder, wrists, legs, and elbows, because typically these regions are located near the rollover point. Therefore, any attempt to move one side of an extremity near the isocenter of the imaging volume places the other side in the vicinity of the rollover point, which results in the aforementioned aliasing problems.

The present invention contemplates a new and improved gradient coil set which overcomes the above-referenced problems and others.

SUMMARY OF THE INVENTION

In accordance with one aspect of the present invention, a magnetic resonance imaging apparatus includes a main magnet for generating a main magnetic field through and surrounding an examination region. A gradient coil assembly generates gradient magnetic fields across the examination region. The gradient magnetic fields have a non-zero first derivative in and adjacent the examination region. An RF transmitter and coil assembly positioned adjacent the examination region excites magnetic resonance dipoles in and adjacent the examination region. An RF coil and receiver assembly receives and demodulates magnetic resonance signals from the resonating dipoles. A reconstruction processor reconstructs the demodulated magnetic resonance signals into an image representation.

In accordance with another aspect of the present invention, a method of magnetic resonance imaging includes inducing resonance in selected dipoles in an examination region such that the selected dipoles generate magnetic resonance signals. A gradient magnetic field is applied across the examination region to encode the magnetic resonance signals along at least one axis. The gradient magnetic field has a non-zero first derivative through and adjacent edges of the examination region. Further, the encoded magnetic resonance signals are received and demodulated. Finally, the demodulated resonance signals are reconstructed into an image representation.

In accordance with another aspect of the present invention, a method of designing a gradient coil assembly for a magnetic resonance imaging system includes selecting radius and length values for a primary gradient coil set and a secondary shielding coil set. The method further includes generating a first continuous current distribution for the primary gradient coil set. The first continuous current distribution is confined within predetermined finite geometric boundaries of a first surface defined above. The first continuous current distribution generates a gradient magnetic field across an examination region where the first derivative of the gradient magnetic field in and adjacent the examination region is non-zero. Further, a second continuous current distribution is generated for the secondary, shielding coil set.

The second continuous current distribution is confined within the predetermined finite geometric boundaries defined above. The first and second continuous current distributions generate a magnetic field which substantially cancels in an area outside the region defined by the secondary, shielding coil set. Next, the primary gradient coil set with the secondary, shielding coil set are optimized using an energy/inductance minimization algorithm. Finally, the primary gradient coil set and secondary, shielding coil set are discretized.

In accordance with another aspect of the present invention, a gradient coil assembly for generating magnetic gradients across a main magnetic field of a magnetic resonance apparatus includes x and y-gradient coils which are configured to generate magnetic field gradients across an examination region along first and second orthogonal axes. The first derivative of the magnetic gradient field generated by the x and y-gradient coils is non-zero in and adjacent the examination region. A z-gradient coil generates magnetic field gradients along a third axis which is orthogonal to the first and second axes. The first derivative of the magnetic field gradient generated by the z-gradient coil is non-zero in and adjacent the examination region.

One advantage of the present invention is that it eliminates aliasing effects for magnetic resonance sequences with large fields of view.

Another advantage of the present invention is that it minimizes the need for a distortion correction algorithm.

Another advantage of the present invention is that it reduces postprocessing time for a magnetic resonance image.

Another advantage of the present invention is that it reduces overall time for a magnetic resonance study.

Yet another advantage of the present invention is that increases the effective imaging volume.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
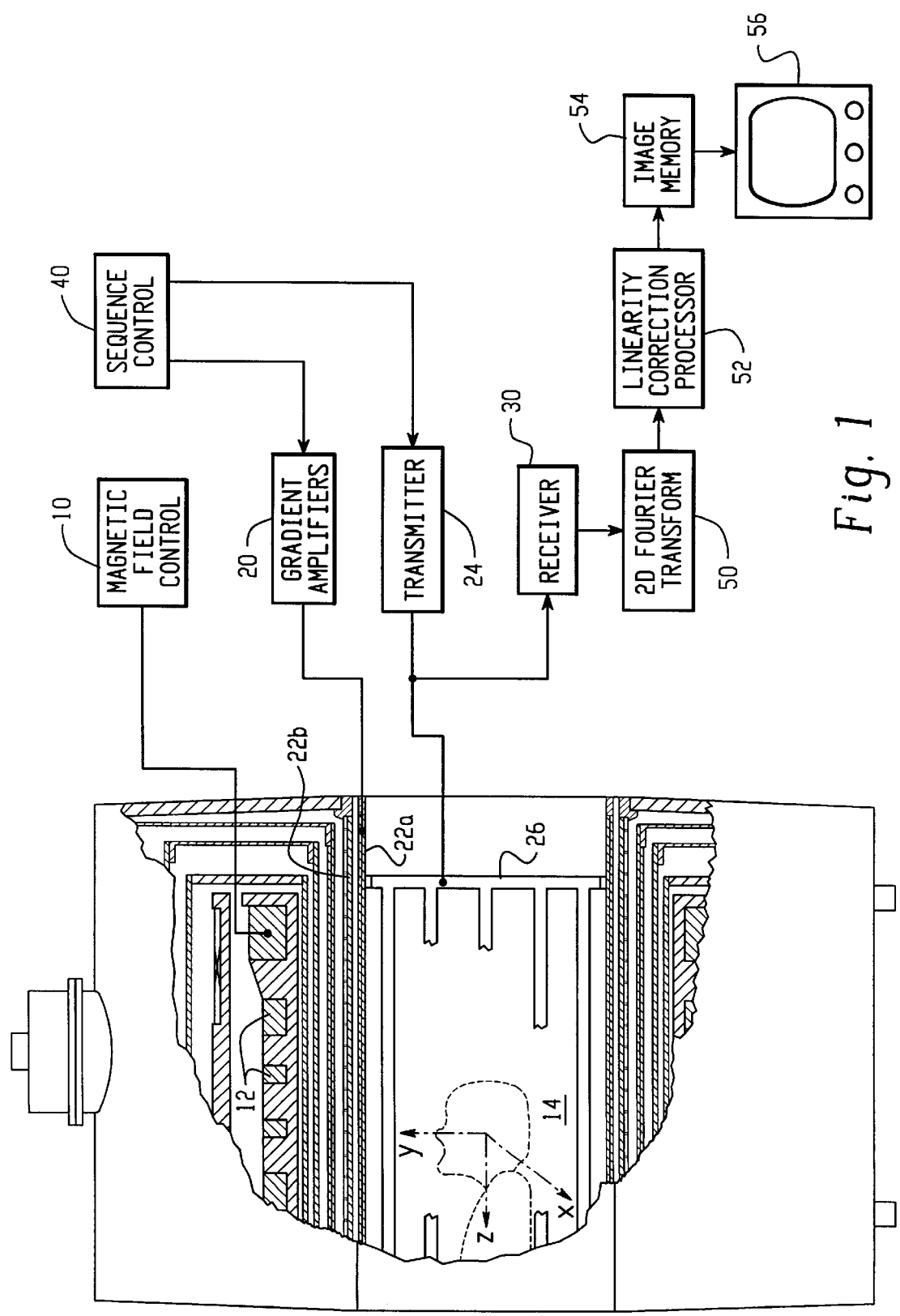
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant main magnetic field is created along a z axis through an examination region 14. Although a bore-type magnet is illustrated in FIG. 1, it is to be appreciated that the present invention is equally applicable to open magnetic systems with vertically directed fields. A couch (not illustrated) suspends a subject to be examined within the examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to a gradient coil assembly 22 that includes pairs of primary gradient coil assemblies 22a and shield gradient coil assemblies 22b with no roll-over point to create magnetic field gradients along x, y, and z axes of the examination region 14 with zero or minimal fringe fields outside of the bore. A digital radio frequency transmitter 24 transmits radio frequency pulses or pulse packets to a whole-body RF coil 26 to transmit RF pulses into the examination region 14. A typical radio frequency pulse is composed of a packet of immediately contiguous pulse segments of short duration which, taken together with each other and any applied gradients, achieve a selected magnetic resonance manipulation. For whole-body applications, the resonance signals are commonly picked up by the whole-body RF coil 26, but may be picked up by other specialized RF coils.

For generating images of local regions of the subject, specialized radio frequency coils are placed contiguous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used only to receive resonance signals introduced by whole-body RF coil transmissions. The resultant radio frequency signals are picked up by the whole-body RF coil 26, the insertable RF coil, or other specialized RF coils and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 30 receives a plurality of data lines in rapid succession following each RF excitation pulse. Ultimately, the radio frequency signals received are demodulated and reconstructed into an image representation by a reconstruction processor 50 which applies a two-dimensional Fourier transform or other appropriate reconstruction algorithm. The image is then stored in an image memory 54. As explained below, the resultant image adjacent its edges tends to be distorted (stretched or contracted). An image linearity correction processor 52 corrects the non-linearity. For example, the gradient field distortion can be empirically measured (see below) and the image can be mapped with the inverse of the mapped field distortion. Other distortion correction algorithms, as are known in the art, can also be utilized. Optionally, the distortion correction can be made in Fourier space prior to reconstruction, incorporated into the reconstruction algorithm, or downstream from the image memory. A human-readable display 56, such as a video monitor, provides a human-readable display of the resultant image. The image may represent a planar slice through the patient, an array of parallel planar slices, a three-dimensional volume, or the like.

Figure 2A:
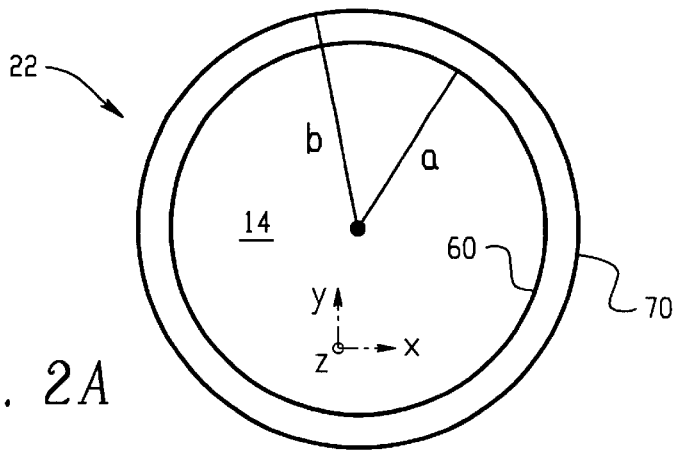
FIG. 2A is a diagrammatic illustration of a cross-section of the gradient coil assembly in accordance with the present invention.
Figure 2B:
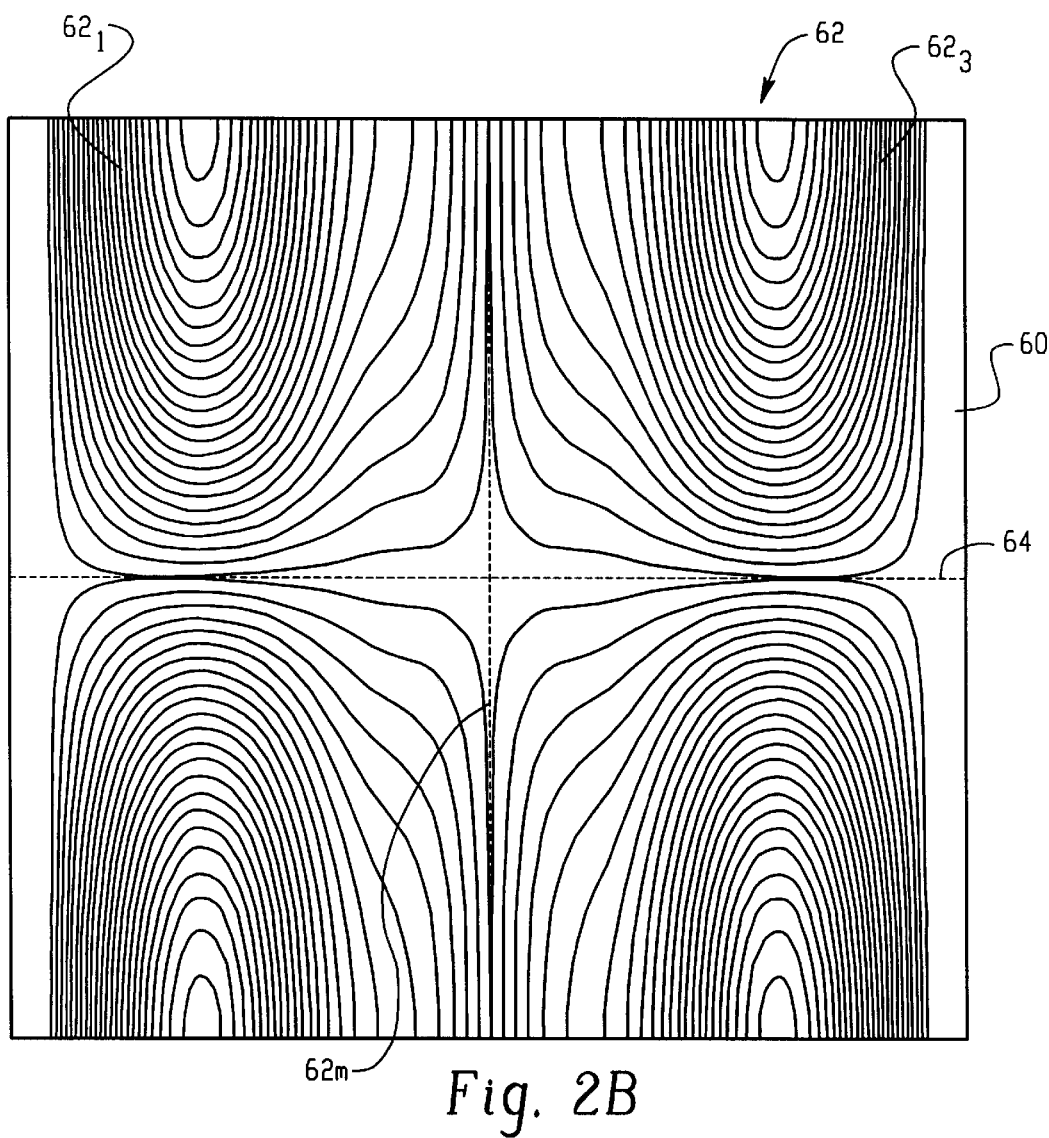
FIG. 2B is a perspective view of a primary gradient coil set in accordance with the present invention.
Figure 6A:
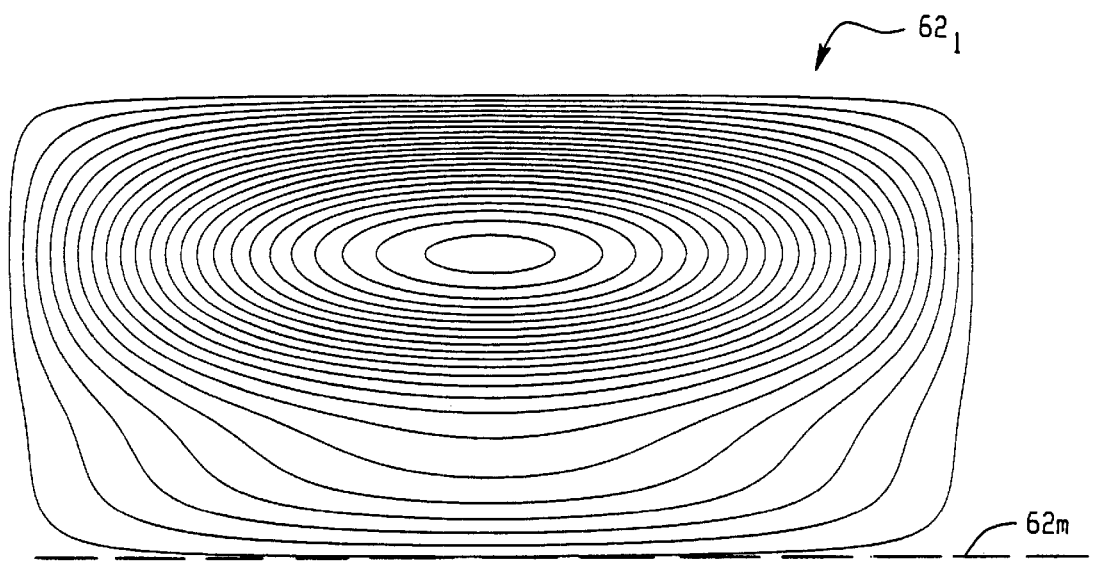
FIGS. 6A and 6B are diagrammatic illustrations of one quadrant of an exemplary primary y-gradient coil and secondary shielding coil in accordance with the present invention.

With reference to FIGS. 2A and 2B and continuing reference to FIG. 1, the primary gradient coil assembly 22a includes an inner dielectric former 60 of radius a. The inner former 60 defines the examination region 14 for receiving a portion of the subject to be examined. Y-gradient coils $62_1$, $62_3$, of a pattern determined by the below-referenced design procedure are laminated to the cylindrical surface of the inner former 60. More specifically, for the y-gradient coil, the quadrant winding $62_1$ of FIG. 6A is connected with a like quadrant winding $62_3$ along edge $62_m$. The pair of winding assemblies $62_1$, $62_3$ are laminated with the edge 64 at the longitudinal center of the former 60 and extending peripherally therearound. The x-gradient coils are mounted to the former 60 but 90 degrees rotated relative to the y-gradient coils. The x and y-gradient coils are electrically insulated from each other and preferably potted in an epoxy. The windings are preferably manufactured from a relatively thin conductive sheet, such as copper. The sheet is preferably cut before lamination to the former by water jet cutting, laser cutting, etching, or the like, and then bonded to a thin insulating substrate, minimizing radial thickness.

A primary z-gradient coil is also constructed of a conductive material, such as foil or wire. The primary z-gradient coil is preferably wound into groves in the inner former 60 and potted in an epoxy. The secondary gradient coil assembly 22b also includes an outer dielectric former 70 of radius b. The secondary x, y, and z shielding coils (not shown) are laminated into the cylindrical surface of the outer former 70 or on longitudinal rods, known as "combs," analogous to the primary gradient coils. These shielding coils are designed to cooperate with the primary gradient coils to generate a magnetic field which has a substantially zero magnetic flux density outside an area defined by the outer former.

Figure 3:
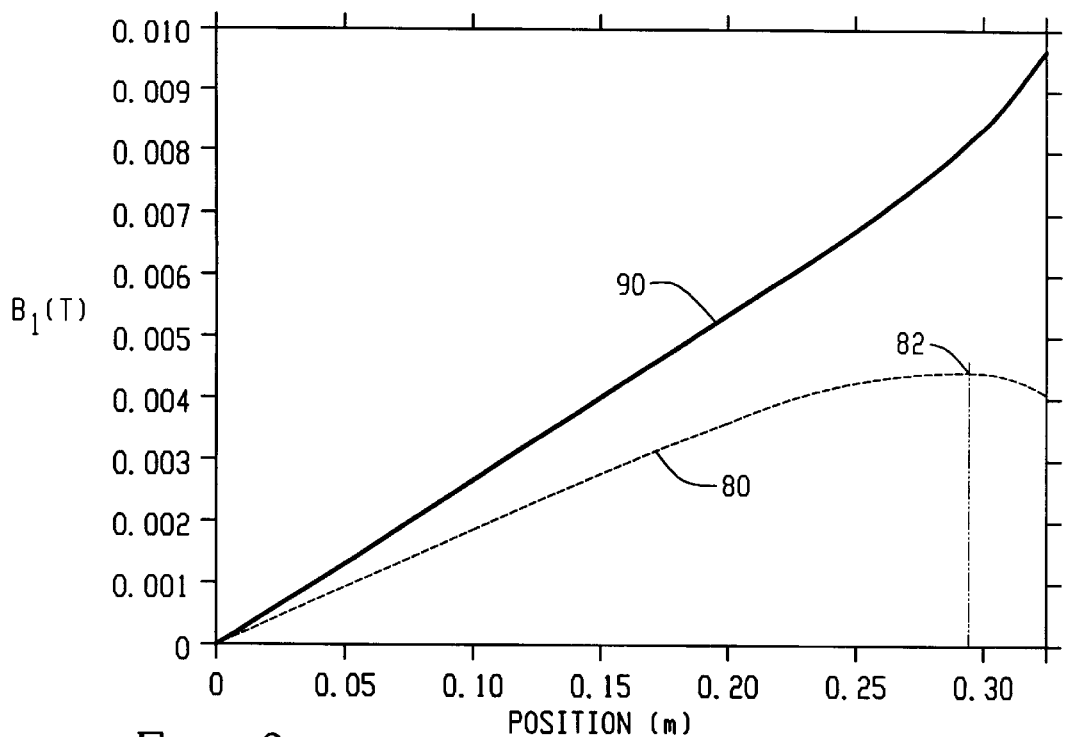
FIG. 3 is an exemplary plot of transverse and longitudinal gradient magnetic field ($B_1$) vs. spatial position for a gradient coil with an inherent rollover point and a gradient coil without an inherent rollover point in accordance with the present invention.

With reference to FIG. 3, prior art gradient coils sets typically are designed such that their gradient magnetic field profile 80 has an inherent rollover point 82 along, but near the edge of its respective axis, as shown. At the rollover point, the first derivative of the gradient magnetic field is zero. After passing the rollover point, where the first derivative is zero, the gradient field takes on non-unique values, i.e., assumes identical values to the gradient field on both sides of the rollover point. This leads to aliasing. When portions of the subject are disposed between the rollover point and the bore, areas of the subject that are located beyond the rollover point will alias back into the image, which causes ghosting of the image. Signals from two planes near the edge that are subject to the same gradient field strength are indistinguishable and are combined. In this manner, a ghost of the material beyond the rollover point is folded back on the material inside the rollover point.

In contrast, the present gradient coil assembly has a flux density 90 that possesses no such rollover point within the physical volume bounded by the inner former, as shown in FIG. 3. By designing the x, y, and z-gradient coils such that the first derivative of the gradient magnetic field in and adjacent to the examination region is non-zero, i.e., there is no rollover point, the above-discussed aliasing problems are minimized. Because there is no rollover point on the graph of gradient magnetic field versus position, all data values are unique. The non-zero first derivative gradient coil design presents regions on the gradient magnetic field vs. position curve 90 which typically increase non-linearity adjacent the edge region. For a reconstruction algorithm that assumes a linear gradient field, the edge regions are stretched in the reconstruction process. The non-linearity of the field is mapped, and the map is loaded into the linearity correction processor 56 to reverse the distortion. When the correction processor is before the reconstruction processor, it maps the actual gradient field back to linear and when it is after the reconstruction processor, it maps the stretched edges of the image back to normal.

The theoretical development, the design procedure and the numerical results for an exemplary shielded gradient coil with no rollover point of the gradient magnetic field along its perspective axis and inside the physical boundaries defined by the inner surface of the gradient tube is now discussed. Specifically, the theoretical development, the design, and the results of a gradient coil where the z component of the magnetic field varies linearly along the transverse direction (x, y-gradient coil), as well as, the axial gradient coil (z-gradient coil) will be presented. The x-gradient coil will be presented in its entirety as a representative for the transverse coils.

Figure 4:
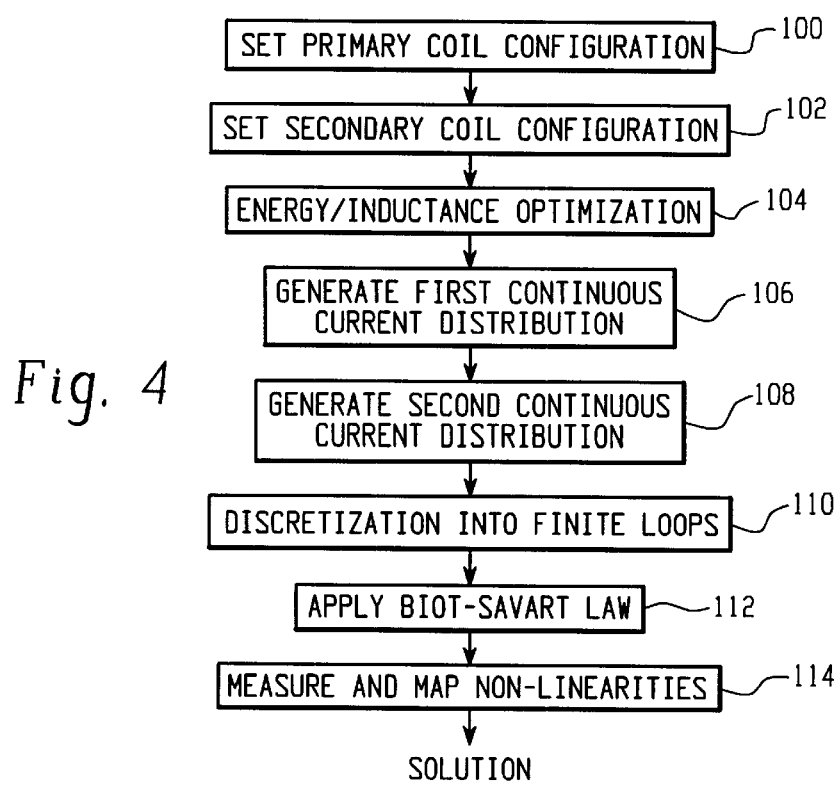
FIG. 4 is a flow chart for designing a shielded gradient coil assembly with a non-zero first derivative of the gradient magnetic field in accordance with the present invention.

The flow chart for designing such a gradient coil structure is shown in FIG. 4. Initially, a geometric configurations of the primary gradient coil step 100 sets the primary coil configuration and a secondary shielding coil configuration step 102 sets the secondary coil configuration. Namely, radius and length for each coil set are chosen. Next, an energy/inductance minimization step 104 optimizes the primary gradient coil set. As a result of the minimization process 104, a first continuous current distribution generation step 106 generates the current distribution for the primary gradient coil set. The first continuous current distribution is confined to the geometric boundaries defined in step 100. The first current distribution is selected such that it generates a magnetic gradient field across the examination region where the first derivative of the gradient magnetic field in and around the examination region is non-zero. Following this step, a second continuous current distribution selection step 108 generates the current distribution for the secondary, shielding coil set such that the second continuous current distribution is confined to the geometric boundaries defined in step 102. The second continuous current distribution generates a magnetic field which, when combined with the magnetic field from the first current distribution, generates a substantially zero fringe magnetic field outside the secondary coil.

Further, in a current discretization step 110, the continuous current distribution of the primary gradient coil set and the secondary, shielding coil set are discretized to generate the number of turns which is required for each coil within each coil set. Optionally, a verifying step 112 applies the Biot-Savart law to the discrete current pattern to verify its validity. Finally, in a measuring and mapping step 114, non-linearities present in the gradient magnetic field near the edges of the examination region are measured and mapped back in order to correct the image near the edges.

The theoretical development of the energy optimization algorithm step 104 is discussed for both the transverse and the axial gradient coil.

The design of a finite, shielded transverse x-gradient coil involves the design of the primary coil (the coil closest to the subject) based on the inverse approach methodology. For the exemplary transverse coil the gradient magnetic field is anti-symmetric in the x direction around the geometric center of the coil, while it is symmetric along the y and z directions. To generate such a field, the analytical expression of the current for the primary coil Ja(r) can be written as:

$$\vec{J}^a(\vec{r}) = [j_\phi^a(\phi,z)\hat{a}_\phi + j_z^a(\phi,z)\hat{a}_z]\delta(\rho-a) \quad (1)$$

where $\delta(\rho-a)$ is the restriction that the current is confined to a cylindrical surface with radius a. The restriction to inner coil length, the confinement of the current density on the cylindrical surface, the azimuthal and axial symmetries for the $j_\phi^a$ and $j_z^a$ and the constraint that the current density obeys the continuity equation provides the Fourier series expansion for both components around the geometric center of the coil as follows:

$$j_\phi^a(\phi,z) = \cos(\phi)\sum_{n=1}^{\infty} j_{\phi n}^a \cos(k_n z) \text{ for } |z| \leq \frac{L_a}{2} \quad (2)$$

$$j_z^a(\phi,z) = \sin(\phi)\sum_{n=1}^{\infty} \frac{-j_{\phi n}^a}{k_n a}\sin(k_n z) \text{ for } |z| \leq \frac{L_a}{2} \quad (3)$$

where $j^a_{\phi n}$ are the Fourier coefficients, $L_a$ represents the total length of the inner coil, and $k_n=(2n\pi)/L_a$ since the current does not flow off the ends of the cylinder. Furthermore, both current components are zero for $|z|>L_a/2$.

In order minimize the fringe field of the primary coil in the area which is outside both the primary and the shielding coils, the Fourier transform of the current for the shielding coil satisfies the following relationship:

$$j_\phi^b(\pm 1, k) = -\frac{aI_1'(ka)}{bI_1'(kb)} j_\phi^a(\pm 1, k) \quad (4)$$

with $$j_\phi^a(\pm 1, k) = \frac{L_a}{4}\sum_{n=1}^{\infty} j_{\phi n}^a \psi_n(k) \quad (5)$$

$$\psi_n(k) = \left[\frac{\sin(k-k_n)\frac{L_a}{2}}{(k-k_n)\frac{L_a}{2}} + \frac{\sin(k+k_n)\frac{L_a}{2}}{(k+k_n)\frac{L_a}{2}}\right]$$

where $I'_m$, $K'_m$ represent the derivatives with respect to the argument of the modified Bessel functions of the first and the second kind.

In this case, the expression for the z component of the magnetic field in the area inside both coils can be written as:

$$B_z = -\frac{\mu_0 a L_a}{4\pi}\cos(\phi)\sum_{n=1}^{\infty} j_{\phi n}^a \int_0^{+\infty} dk\, k\cos(kz)\psi_n(k)I_1(k\rho)K_1'(ka) \quad (6)$$

$$\left[1 - \frac{I_1'(ka)K_1'(kb)}{I_1'(kb)K_1'(ka)}\right]$$

Furthermore, the expression for the stored magnetic energy can also be written as:

$$W = -\frac{\mu_0 a^2 L_a^2}{16}\sum_{n=1}^{\infty}\sum_{n'=1}^{\infty} j_{\phi n}^a j_{\phi n'}^a \int_0^{+\infty} dk\, \psi_n(k)\psi_{n'}(k)I_1'(ka)K_1'(ka) \quad (7)$$

$$\left[1 - \frac{I_1'(ka)K_1'(kb)}{I_1'(kb)K_1'(ka)}\right]$$

As a next step, the functional $\in$ is constructed in terms of W and $B_z$ as:

$$\varepsilon(j_{\phi n}^a) = W - \sum_{j=1}^{N} \lambda_j(B_z(\vec{r}_j) - B_{zSC}(\vec{r}_j)) \quad (7a)$$

where $\lambda$ are the Lagrange multipliers and $B_{zSC}$ represents the constraint values of the z component of the magnetic field at the specified N points. Minimizing $\in$, a quadratic function of the current, with respect to the current coefficients $j^a_{\phi n}$, results in a matrix equation for $j^{a\phi n}$, as:

$$\sum_{n'=1}^{\infty} j_{\phi n'}^a \frac{aL_a\pi}{2}\int_0^{+\infty} dk\, \psi_n(k)\psi_{n'}(k)I_1'(ka)K_1'(ka)\left[1 - \frac{I_1'(ka)K_1'(kb)}{I_1'(kb)K_1'(ka)}\right] = \quad (8)$$

$$\sum_{j=1}^{N}\cos(\phi_j)\int_0^{+\infty} dk\, k\cos(kz_j)\psi_n(k)I_1(k\rho_j)K_1'(ka)\left[1 - \frac{I_1'(ka)K_1'(kb)}{I_1'(kb)K_1'(ka)}\right],$$

where the evaluation of the Lagrange multipliers $\lambda_j$ can be done via the constraint equation.

By truncating the previous infinite summations at M terms, and using compact notation, the previous expression is modified to read:

$$\sum_{n'=1}^{M} j_{\phi n'}^a C_{n',n} = \sum_{j=1}^{N} \lambda_j D_{jn} \quad (9)$$

or in matrix form:

$$J^a C = \lambda D \rightarrow J^a = \lambda D C_{-1} \quad (10)$$

but $$B_z = J^a D^t \rightarrow B_z = \lambda D C^{-1} D^t \quad (11)$$

which leads to $$\lambda = B_z [DC^{-1}D^t]^{-1} \rightarrow J^a = B_z [DC^{-1}D^t]^{-1} DC^{-1} \quad (12).$$

Inverting the previous matrix equation, a solution for $j^a_{\phi n}$, and hence for the current density, is obtained. When the continuous current distribution for both the primary and shield coils is evaluated, the stream function technique is used to discretize the current density for both primary and shield coils in such a way that the absolute integer number of turns is obtained for both coils for a given common current value per loop. The discretization and the magnetic gradient field inside the desired imaging volume are then calculated proceeding with steps 6 through 8 of FIG. 4.

For the design of the exemplary primary x-gradient coil, the radius of the cylinder for the primary coil is set equal to 0.3438500 m and its total length is restricted to 1.066400 m. In addition, the radius of the secondary coil is equal to 0.435224 m. The constraints for the design of the primary coil are shown in Table 1. The constraints for the primary y-gradient coil are shown in Table 2.

TABLE 1

Constraint set used for the design for the x-gradient coil. Values for $\rho$ and z are in m, values for $B_{zsc}(T)$ are in Tesla.

| n | $\rho_i$ | $z_i$ | $B_{zsc}(T)$ |
|---|---|---|---|
| 1 | 0.001 | 0.000 | 0.000027000 |
| 2 | 0.230 | 0.000 | 0.006211244 |
| 3 | 0.001 | 0.200 | 0.000021600 |

As shown in Table 1, the first constraint point defines a gradient strength for the first primary and single shield coil to be 27.0 mT/m, the second constraint point specifies a +0.1% linearity of the gradient field along the gradient (x) axis and up to the distance of 23.0 cm for the isocenter of the gradient field, while the third constraint point specifies a −20% uniformity of the gradient field inside the 40 cm imaging volume.

TABLE 2

Constraint set used for the design for the y-gradient coil. Values for $\rho$ and z are in m, values for $B_{zsc}(T)$ are in Tesla.

| n | $\rho_i$ | $z_i$ | $B_{zsc}(T)$ |
|---|---|---|---|
| 1 | 0.001 | 0.000 | 0.000027000 |
| 2 | 0.265 | 0.000 | 0.007870500 |
| 3 | 0.001 | 0.200 | 0.0000217800 |

For the exemplary y-gradient shielded coil, the radius of the primary coil is a =0.336040 m with a length of 1.0534 m, while the radius of the secondary coil is b=0.431414 m. As shown in Table 2, the first constraint point defines a gradient strength to be 27.0 mT/m, the second constraint point specifies a +10% linearity of the gradient field along the gradient (x) axis and up to the distance of 26.5 cm for the isocenter of the gradient field, while the third constraint point specifies a −20% uniformity of the gradient field inside the 40 cm imaging volume.

Figure 5A:
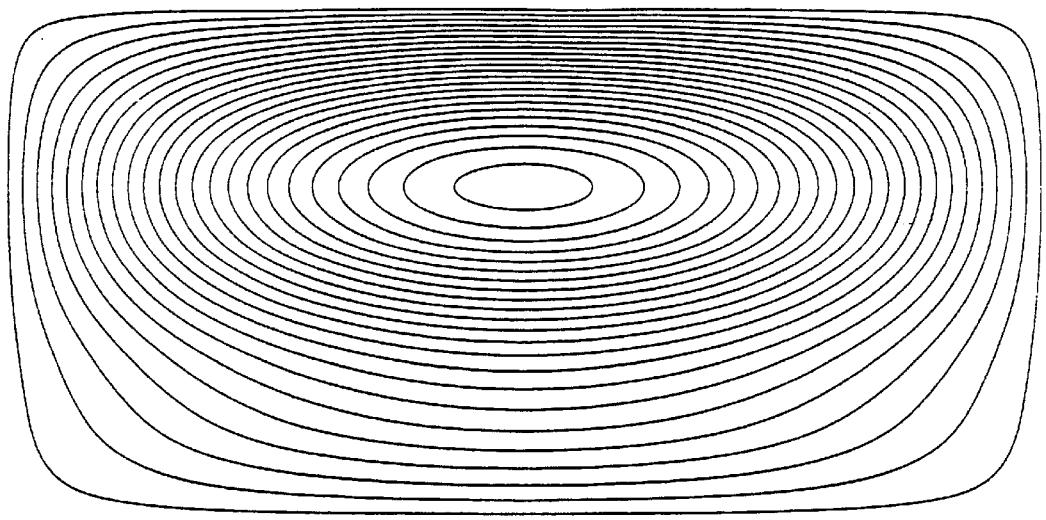
FIGS. 5A and 5B are diagrammatic illustrations of one quadrant of an exemplary primary x-gradient coil and secondary shielding coil in accordance with the present invention.
Figure 5B:
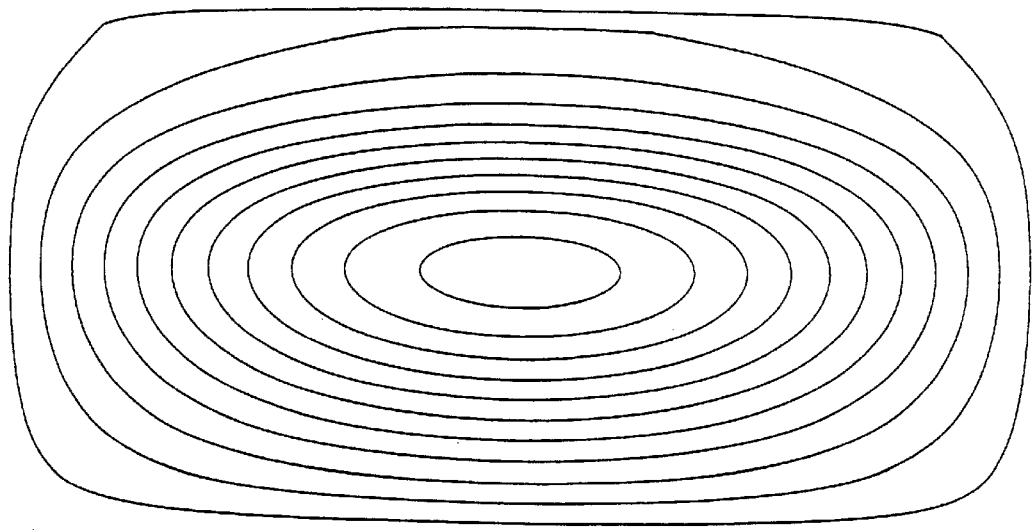

With the presence of these constraints on Tables 1 and 2, and the application of the inverse approach methodology of FIG. 4, the values for the Fourier coefficients for the current density of the shielded x and y-gradient coils are generated. Applying the Stream Function technique to the continuous current densities for both transverse shielded coils, the discrete current patterns for these coils were generated. Specifically, the x-gradient coil, the Stream Function technique generates 23 discrete loops on one quadrant of the primary coil, as shown in FIGS. 5A and 11 loops on one quadrant of the single shield, as shown in FIG. 5B. The common current per loop is 376.99 amps. In this case, the eddy current from the discrete coil configuration is 0.245% over a 50 cm DSV.

Figure 6B:
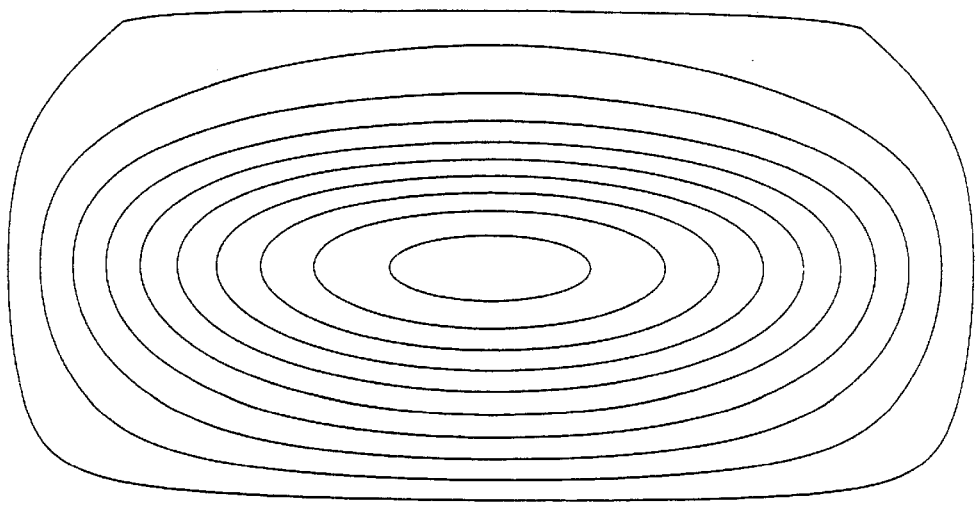

By discretizing the current density for the y-gradient coil, the current density for one quadrant of the exemplary primary coil is approximated by 23 loops with a common current of 375.11 amps, as shown in FIG. 6A, while the one quadrant of the shielding coil can be approximated by 10 loops carrying the same current per loop (FIG. 6B). For the y-gradient coil, the eddy currents are only 0.257%. Employing the Biot-Savart law to the discrete current densities for both the x- and y shielded gradient coils, the gradient magnetic field for both of these coils is evaluated along the perspective gradient axis and at the z=0.0 plane. The behavior of the gradient magnetic field for the x-gradient coil again is substantially as illustrated in FIG. 3.

The behavior of the gradient magnetic field for the y-gradient coil is substantially as shown in FIG. 3. Table 3 illustrates the magnetic properties for the x and y shielded gradient coils in more specific detail with a single shield.

TABLE 3

Gradient field characteristics for the shield x and y-gradient coils.

| Properties | x-gradient coil | y-gradient coil |
|---|---|---|
| Gradient Strength (mT/m) | 27 | 27 |
| Gradient Linearity ($\rho$ = ±22.5 Cm) | 0.8% | 7.8% |
| Gradient Uniformity (z = ±20.0 Cm) | −20% | −20% |
| Rise Time @ 700V | 465 $\mu$sec | |
| Slew Rate @ 700V | 60 T/m/sec | 61 T/m/sec |
| % Eddy Current on 50 cm DSV | 0.245% | 0.257% |

Initially, the design of the finite shielded axial z-gradient coil involves the design of the primary coil (the coil that is closest to the subject) based on the inverse approach methodology. For z-gradient coil, the gradient magnetic field is anti-symmetric in the z direction around the geometric center of the coil, while it is symmetric along the x and y directions. Thus, in this case there is no azimuthal dependance on the current density. To generate such a field, the analytical expression of the current for the primary coil $J^a(r)$ can be written as:

$$\vec{J}^a(\vec{r}) = j_\phi^a(Z)\hat{a}_\phi \delta(\rho - a) \tag{13}$$

where $\delta(\rho-a)$ is the restriction that the current is confined on the cylindrical surface with radius a. The restriction to inner coil length, the confinement of the current density on the cylindrical surface, the azimuthal and axial symmetries for the $j^a_\phi$ and the constraint that the current density obeys the continuity equation provides the Fourier series expansion for both components around the geometric center of the coil as follows:

$$j_\phi^a(z) = \sum_{n=1}^{\infty} j_{\phi n}^a \sin(k_n z) \text{ for } |z| \leq \frac{L_a}{2} \tag{14}$$

where $j^a_{\phi n}$ are the Fourier coefficients, $L_a$ represents the total length of the inner coil, and $k_n=(2 n\pi)/L_a$ since the current does not flow off of the ends of the cylinder. Furthermore, the current component is zero for $|z|>L_a/2$.

In order to minimize the fringe field of the primary coil in the area which is outside both the primary and the shielding coil, the Fourier transform of the current for the shielding coil satisfies the following relationship:

$$j_\phi^b(k) = -\frac{aI_1(ka)}{bI_1(kb)} j_\phi^a(k) \tag{15}$$

with $$j_\phi^a(k) = \frac{iL_a}{2} \sum_{n=1}^{\infty} j_{\phi_n}^a \psi_n(k) \tag{16}$$

$$\psi_n(k) = \left[ \frac{-\sin(k-k_n)\frac{L_a}{2}}{(k-k_n)\frac{L_a}{2}} + \frac{\sin(k+k_n)\frac{L_a}{2}}{(k+k_n)\frac{L_a}{2}} \right]$$

where $I_m$, $K_m$ represent the derivatives with respect to the argument of the modified Bessel functions of the first and second kind.

In this case, the expression for the z component of the magnetic field $B_z$ in the area inside both coils can be written as:

$$B_z = -\frac{\mu_0 a L_a}{2\pi} \tag{17}$$

$$\sum_{n=1}^{\infty} j_{\phi_n}^a \int_0^{+\infty} dk\, k \sin(kz) \psi_n(k) I_0(k\rho) K_1(ka) \left[ 1 - \frac{I_1(ka)K_1(kb)}{I_1(kb)K_1(ka)} \right]$$

Furthermore, the expression for the stored magnetic energy can also be written as:

$$W = \frac{\mu_0 a^2 L_a^2}{4} \sum_{n=1}^{\infty} \sum_{n'=1}^{\infty} j_{\phi_n}^a j_{\phi'_n}^a \tag{18}$$

$$\int_0^{+\infty} dk\, \psi_n(k) \psi_{n'}(k) I_1(ka) K_1(ka) \left[ 1 - \frac{I_1(ka)K_1(kb)}{I_1(kb)K_1(ka)} \right]$$

As a next step, we construct the functional $\in$ in terms of W and $B_z$ as $$\varepsilon(j_{\phi_n}^a) = W - \sum_{j=1}^{N} \lambda_j \left( B_z(\vec{r}_j) - B_{zSC}(\vec{r}_j) \right) \tag{18a}$$

where $\lambda_j$ are the Lagrange multipliers and $B_{zSC}$ represent the constraint values of the z component of the magnetic field at the specified N points. Minimizing $\in$, a quadratic function of the current, with respect to the current coefficients $j^a_{\phi n}$, results in a matrix equation which $j^a_{\phi n}$, satisfies:

$$\sum_{n'=1}^{\infty} j_{\phi'_n}^a (aL_a\pi) \int_0^{+\infty} dk\, \psi_n(k) \psi_{n'}(k) I_1(ka) K_1(ka) \left[ 1 - \frac{I_1(ka)K_1(kb)}{I_1(kb)K_1(ka)} \right] = \tag{19}$$

$$-\sum_{j=1}^{N} \int_0^{+\infty} dk\, k \sin(kz_j) \psi_n(k) I_0(k\rho_j) K_1(ka) \left[ 1 - \frac{I_1(ka)K_1(kb)}{I_1(kb)K_1(ka)} \right]$$

where the evaluation of the Lagrange multipliers $\lambda_j$ can be done via the constraint equation.

By truncating the previous infinite summations at M terms, and using compact notation, the previous expression is modified to read:

$$\sum_{n'=1}^{M} j_{\phi'_n}^a C_{n',n} = \sum_{j=1}^{N} \lambda_j D_{jn} \tag{20}$$

or in matrix form:

$$J^a C = \lambda D \rightarrow J^a = \lambda DC^{-1} \tag{21}$$

but, $$B_z = J^a D' \rightarrow B_z = \lambda DC^{-1} D' \tag{22}$$

which leads to $$\lambda = B_z [DC^{-1}D']^{-1} \rightarrow J^a = B_z [DC^{-1}D']^{-1} DC^{-1} \tag{23}$$

Inverting the previous matrix equation, a solution for $j^a_{\phi n}$, and hence for the current density, is obtained. When the continuous current distribution for both the primary and shield coils $J^a$, $J^b$ is evaluated, the application of the center of mass technique yields the discrete loop patterns for both primary and shield coils with the extra constraint that the absolute integer number of turns for both coils for a given common current value per loop is obtained. The discretization and the magnetic gradient field inside the desired imaging volume are then calculated proceeding with steps 6 through 8 of FIG. 4.

Similar design procedures are followed for the exemplary axial gradient coil. In this case the radius of the cylinder for the first primary coil is set equal to 0.356000 m and its total length is set to 1.050 m. In addition, the radius of the secondary coil is equal to 0.424929 m. For the design of the primary coil the constraints are shown in Table 4.

TABLE 4

Constraint set used for the design for the shielded z-gradient coil. Values for ρ and z are in m, $B_{zsc}$(T) are in Tesla.

| n | $\rho_{76}$ | $z_i$ | $B_{zsc}$(T) |
|---|---|---|---|
| 1 | 0.0000 | 0.001 | 0.000025000 |
| 2 | 0.0000 | 0.265 | 0.0072875000 |
| 3 | 0.1125 | 0.001 | 0.000025000 |
| 4 | 0.2250 | 0.001 | 0.000025000 |

As shown in Table 4, the first constraint point defines a gradient strength for the primary and shield coil to be 25.0 mT/m, the second constraint point specifies a +10% linearity of the gradient field along the gradient (z) axis and up to the distance of 26.5 cm for the isocenter of the gradient field, while the rest of the constraint points specify the uniformity of the gradient field inside the 45 cm imaging volume.

With the presence of these constraints on Table 4 and the application of the inverse approach methodology of FIG. 4, the values for the Fourier coefficients for the current density of the shielded z-gradient coil are generated. Applying the center of mass technique to the continuous current densities for both the primary coil and the shielding coil, the discrete current patterns for these coils were generated. Specifically, for the preferred first primary and the shield configuration, the center of mass technique generates 60 discrete loops on the primary coil and 30 loops on the single shield. The common current per loop is 347.388 amps. In this case, the eddy current from the discrete coil configuration is 0.19% over a 50 cm DSV. Table 5 illustrates the magnetic properties of the shielded x-gradient coil.

TABLE 5

Gradient field characteristics for the z-gradient coil.

| Properties | z-gradient coil |
|---|---|
| Gradient Strength (mT/m) | 25 |
| Gradient Linearity (ρ = ±22.5 cm) | +0.14% |
| Gradient Uniformity | 4.56% |

TABLE 5-continued

Gradient field characteristics for the z-gradient coil.

| Properties | z-gradient coil |
|---|---|
| (z = ±20.0 cm) | |
| Rise Time @ 700V | 312 μsec |
| Slew Rate @ 700V | 80 T/m/sec |
| % Eddy Current on | 0.19% |
| 45 cm DSV | |

Figure 7A:
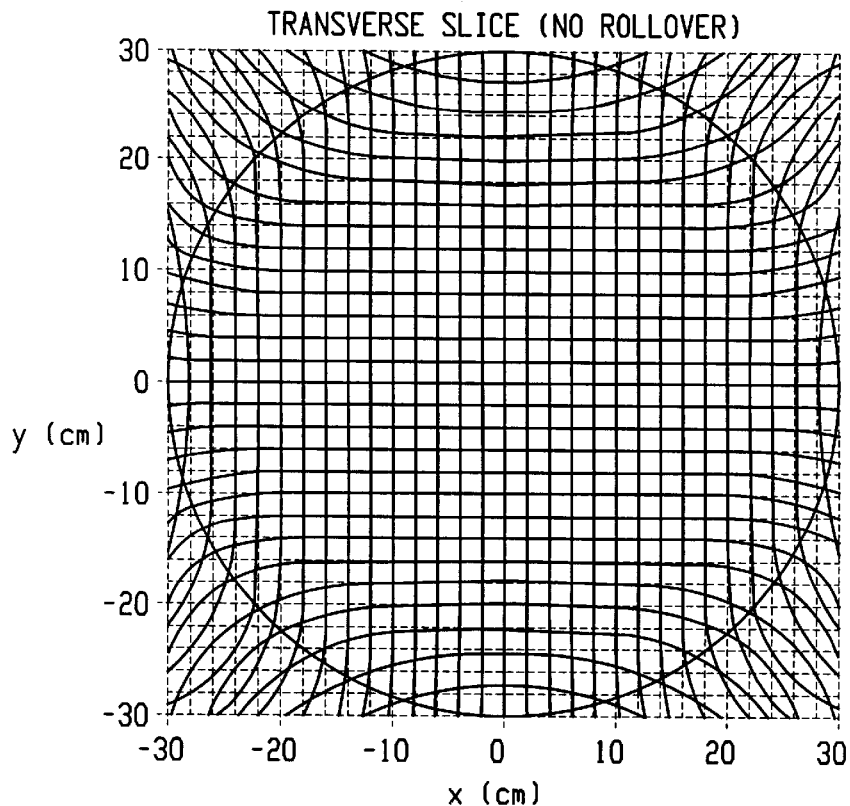
FIG. 7A is a distortion grid for a transverse slice through the z=0.0 plane for an exemplary gradient coil set with no rollover point in accordance with the present invention.
Figure 7B:
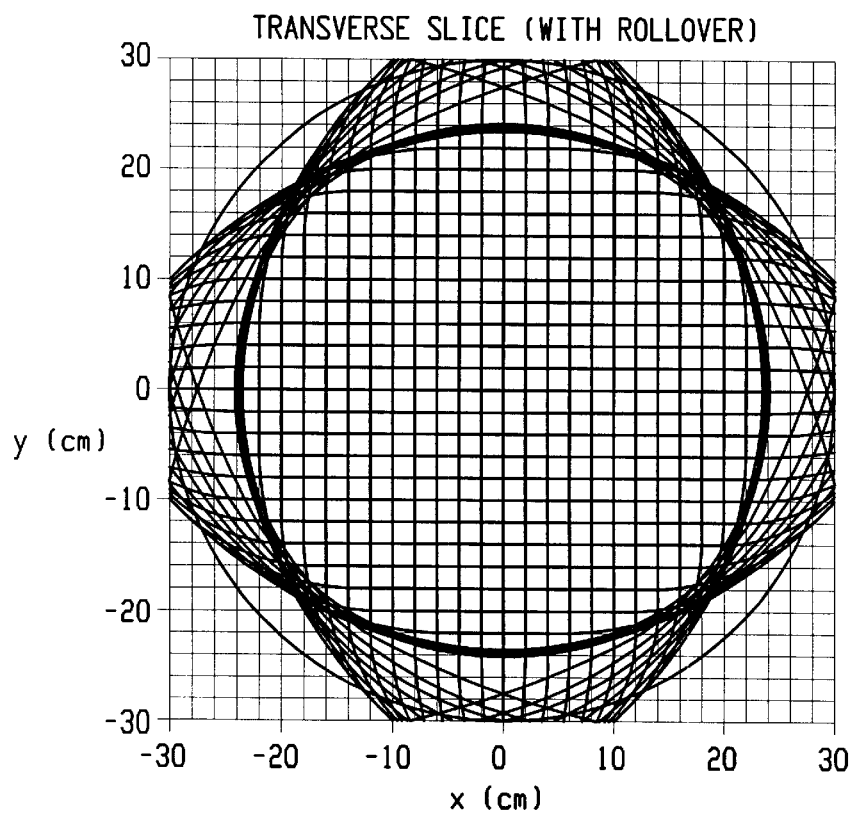
FIG. 7B is a distortion grid for a transverse slice through the z=0.0 plane for an exemplary gradient coil set with an inherent rollover point in accordance with the prior art.

With reference to FIGS. 7A and 7B, images of linear distortion grids are generated for the transverse orientations (x,y plane) corresponding to the x and y gradient coils for gradient fields with and without a rollover point inside the physical space defined by the inner diameter of the gradient structure. Comparing the images from gradient coils with and without a rollover point inside a 60 cm diameter sphere, both are substantially linear near the isocenter. It will be seen in FIG. 7B, that the grid lines adjacent the image fold back and overlap each other. This severe aliasing cannot be corrected by a distortion algorithm. This is not the case in FIG. 7A, where the gradient field does not have a rollover point inside the physical space defined by the dimensions of the gradient coil. Rather, because the grid lines spread uniquely at the edge, it is relatively simple to map the grid back into straight lines. This same map corrects subsequent images.

Figure 8A:
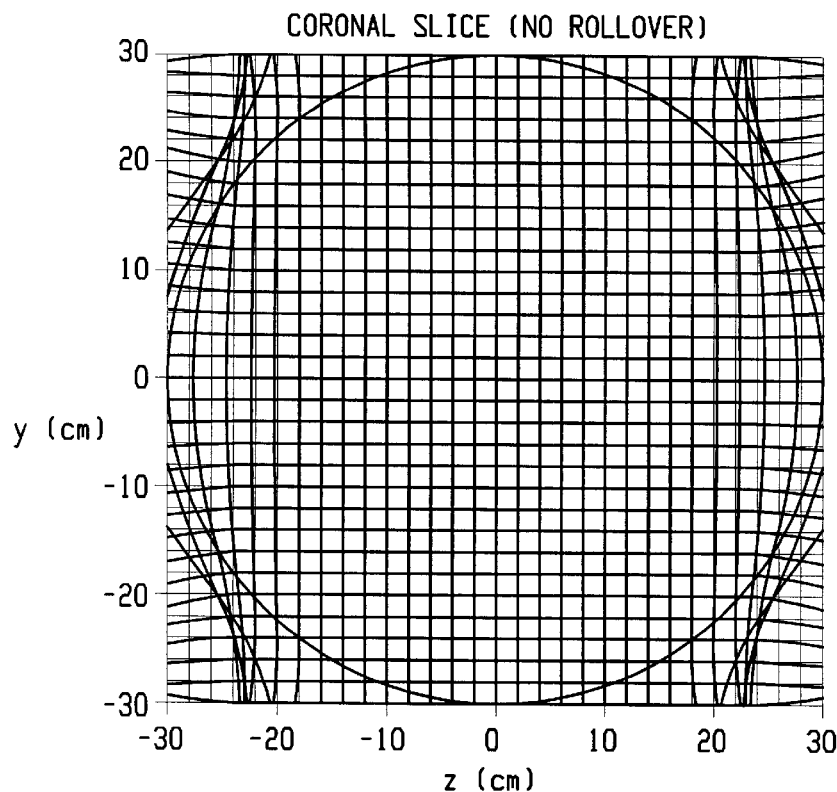
FIG. 8A is a coronal distortion grid for an exemplary gradient coil set with no rollover point in accordance with the present invention.
Figure 8B:
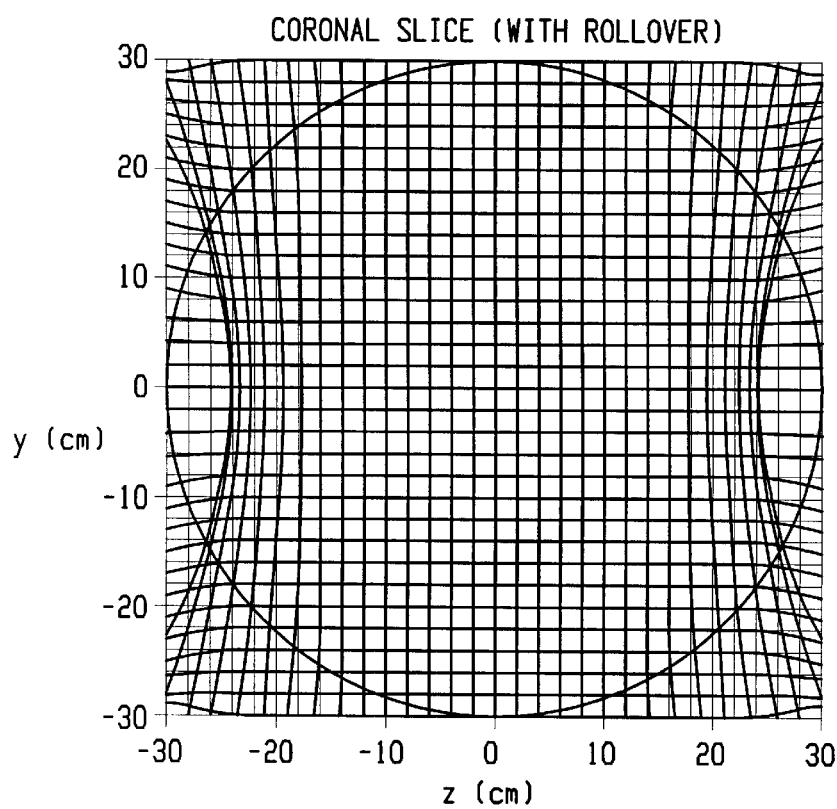
FIG. 8B is a coronal distortion grid an exemplary gradient coil set with an inherent rollover point in accordance with the prior art.

Similar results are obtained in the coronal orientation (y,z plane). Compare coronal images of the grid phantom from the gradient set without a rollover point (FIG. 8A) to the distorted grid image generated by the gradient set with an inherent rollover point (FIG. 8B). In FIG. 8B, the rollover point causes grid lines along the side to be compressed and indistinguishably overlap each other. By contrast, in FIG. 8A, the image is magnified (expanded outward) along the edges keeping each grid line warped but unique. The warped but unique grid lines are readily mapped to linear.

Similar conclusions are drawn by comparing the sagittal distortion grid of a gradient set without a rollover point to the distortion grid of a gradient set with an inherent rollover point (not illustrated).

It should be appreciated that the specified current patterns can be changed to produce either better linearity at the price of coil efficiency, and/or greater efficiency at the price of linearity. Further, the dimensions (radius and/or length) of the cylindrical gradient coils can be changed to be increased or decreased according to the preferred application. In addition, the lengths of the primary coils and/or the secondary coils can be similar or different.

The present invention is applicable to other alternative gradient coil geometries, such as elliptical, planar, flared, etc., as well as the asymmetric gradient coil designs or any combination thereof. The present invention is also applicable to the design of gradient coil structures suitable for vertically oriented or open magnet systems. Further, the disclosed primary and screen coil set can be bunched (concentrated) or thumbprint designs generated using forward or inverse approach methods. In addition, the primary and the shield coils can have any possible mixing of bunched and/or thumbprint designs. It is contemplated that zero net thrust force or torque can be incorporated into the proposed design algorithm in a known manner.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A magnetic resonance imaging apparatus comprising:
   a main magnet for generating a main magnetic field through and surrounding an examination region;
   a gradient coil assembly for generating gradient magnetic fields across the examination region, which gradient magnetic fields have a non-zero first derivative in and adjacent the examination region, the gradient coil assembly including:
      a primary gradient coil set disposed adjacent the examination region, said primary gradient coil set including an array of conductive loops for generating the gradient magnetic fields along three orthogonal axes;
      a secondary shielding coil set disposed between the primary coil assembly and the main magnet, said secondary shielding coil set including an array of conductive loops such that a current density flowing thereon causes a magnetic flux density which interacts with a magnetic flux density generated by the primary magnetic field to substantially zero a net magnetization flux density outside an area defined by the secondary shielding coil set;
   an RF transmitter and coil assembly positioned adjacent the examination region such that it excites magnetic resonance dipoles in and adjacent the examination region;
   an RF coil and receiver assembly which receives and demodulates magnetic resonance signals from the resonating dipoles; and
   a reconstruction processor for reconstructing the demodulated magnetic resonance signals into an image representation.

2. The magnetic resonance imaging apparatus according to claim 1, wherein primary gradient coil set and secondary shielding coil set are arranged on formers.

3. The magnetic resonance imaging apparatus according to claim 2, wherein the formers are hollow cylindrical tubes arranged such that the examination region is defined inside the former of the primary gradient coil set with the former of the primary gradient coil set positioned inside the former of the secondary, shielding coil set.

4. A magnetic resonance imaging apparatus comprising:
   a main magnet for generating a main magnetic field through and surrounding an examination region;
   a gradient coil assembly for generating gradient magnetic fields across the examination region, a gradient magnetic field generated along at least one axis having (i) a substantially constant slope along a central region of the examination region and (ii) an increasingly step slope adjacent edges of the examination region;
   an RF transmitter and coil assembly positioned adjacent the examination region such that it excites magnetic resonance dipoles in and adjacent the examination region;
   an RF coil and receiver assembly which receives and demodulates magnetic resonance signals from the resonating dipoles;
   a reconstruction processor for reconstructing the demodulated magnetic resonance signals into an image representation; and
   a linearity correction processor which adjusts at least one of the demodulated resonance signals and the image representation to correct for distortion attributable to the increasingly steep slope of the gradient magnetic field adjacent edges of the examination region.

5. A magnetic resonance imaging apparatus comprising:
a main magnet for generating a main magnetic field through and surrounding an examination region;
a gradient coil assembly for generating gradient magnetic fields across the examination region, the gradient coil assembly including:
three primary gradient coil sets, one for generating a gradient magnetic field along each of three orthogonal axes, each of the primary gradient coil sets generating a corresponding gradient magnetic field which is linear adjacent a central region of the examination region and monotonically increasing adjacent edges of the examination region;
an RF transmitter and coil assembly positioned adjacent the examination region such that it excites magnetic resonance dipoles in and adjacent the examination region;
an RF coil and receiver assembly which receives and demodulates magnetic resonance signals from the resonating dipoles; and
a reconstruction processor for reconstructing the demodulated magnetic resonance signals into an image representation.

6. The magnetic resonance imaging apparatus according to claim 5, further including a secondary coil disposed around the primary gradient coil sets, the primary gradient coil sets and the secondary coil cooperating to generate the magnetic field gradients in the examination region and to minimize magnetic field gradients outside of the examination region.

7. A method of magnetic resonance imaging comprising:
inducing resonance in selected dipoles in an examination region such that the selected dipoles generate magnetic resonance signals;
applying a gradient magnetic field along three orthogonal axes across the examination region to encode the magnetic resonance signals, a first derivative of the gradient magnetic field being non-zero throughout the examination region, such that the gradient magnetic field along each axis is unique in and adjacent edges of the examination region;
receiving and demodulating the encoded resonance signals;
reconstructing the demodulated resonance signals into an image representation.

8. A magnetic resonance imaging method comprising:
inducing resonance in selected dipoles in an examination region such that the selected dipoles generate magnetic resonance signals;
applying a gradient magnetic field across the examination region to encode the magnetic resonance signals along at least one axis, the gradient magnetic field (i) having a non-zero first derivative through the examination region, (ii) being substantially linear across a central region of the examination region, and (iii) changing strength monotonically adjacent edges of the examination region;
receiving and demodulating the encoded resonance signals;
reconstructing the demodulated resonance signals into an image representation.

9. A magnetic resonance imaging method comprising:
inducing resonance in selected dipoles in an examination region such that the selected dipoles generate magnetic resonance signals;
applying a gradient magnetic field across the examination region to encode the magnetic resonance signals along at least one axis, the gradient magnetic field having (i) a substantially constant slope across the central region of the examination region and (ii) a continuously increasing slope adjacent an edge of the examination region;
receiving and demodulating the encoded resonance signals;
reconstructing the demodulated resonance signals into an image representation; and
adjusting one of (i) the demodulated resonance signals and (ii) the reconstructed image representation to correct for distortions attributable to the continuously increasing slope of the gradient magnetic field adjacent the edge of the examination region.

10. A method of designing a gradient coil assembly for magnetic resonance imaging systems, the method comprising:
(a) selecting radius and length for a primary gradient coil set and radius and length for a secondary, shielding coil set;
(b) generating a first continuous current distribution for the primary gradient coil set such that the first continuous current distribution is confined within predetermined finite geometric boundaries of a first surface defined in step (a), said first continuous current distribution generating a gradient magnetic field across an examination region whose first derivative in and adjacent the examination region is non-zero;
(c) generating a second continuous current distribution for the secondary, shielding coil set such that the second continuous current distribution is confined within the predetermined finite geometric boundaries defined in step (a), the first and second continuous current distributions generating a magnetic field which substantially cancels in an area outside a region defined by the secondary, shielding coil set;
(d) optimizing the primary gradient coil set with the secondary, shielding coil set utilizing an energy/inductance minimization algorithm; and
(e) discretizing the primary gradient coil set and the secondary, shielding coil set.

11. The method according to claim 10, wherein the method further comprises:
(f) applying the Biot-Savart law to the discrete current pattern to verify its validity; and
(g) measuring and mapping non-linearities present in one of (i) the gradient magnetic field near edges of the examination region and (ii) edges of magnetic resonance images of a subject extending substantially to the edges of the examination region in order to generate a correction map.

12. A shielded gradient coil assembly designed by the method of claim 12.

13. A gradient coil assembly for generating magnetic gradients across a main magnetic field of a magnetic resonance apparatus, the gradient coil assembly comprising:
x and y-gradient coils configured to generate magnetic field gradients across an examination region along first and second orthogonal axes, a first derivative of the magnetic gradient field generated by the x and y-gradient coils in and adjacent the examination region being non-zero; and a z-gradient coil for generating magnetic field gradients along a third axis orthogonal to the first and second axes, a first derivative of the magnetic field gradient generated by the z-gradient coil in and adjacent the examination region being non-zero.

14. The gradient coil assembly according to claim 13, wherein the x, y, and z-gradient coils include primary and secondary x, y, and z-gradient coils for generating the magnetic field gradients within the examination region and substantially zeroing magnetic field gradients outside of the gradient coils.

15. The gradient coil assembly according to claim 11, wherein the magnetic field gradients generated by at least one of the x, y, and z-gradient coils is substantially linear across a central portion of the examination region and monotonically increasing adjacent edges of the examination region.

16. A magnetic resonance imaging apparatus comprising:

a main magnet for generating a main magnetic field through and surrounding an examination region;

a gradient coil assembly for generating gradient magnetic fields along three orthogonal axes across the examination region, a first derivative of the gradient magnetic fields generated by the gradient coil assembly being non-zero in and adjacent the examination region;

an RF transmitter and coil assembly positioned adjacent the examination region such that it excites magnetic resonance dipoles in and adjacent the examination region;

an RF coil and receiver assembly which receives and demodulates magnetic resonance signals from the resonating dipoles; and a reconstruction processor for reconstructing the demodulated magnetic resonance signals into an image representation.

17. The magnetic resonance imaging apparatus according to claim 16, wherein the gradient magnetic field generating along at least one axis has (i) a substantially constant slope along a central region of the examination region and (ii) an increasingly steep slope adjacent edges of the examination region.

* * * * *